US009116443B2

(12) United States Patent
Modderman (10) Patent No.: US 9,116,443 B2
(45) Date of Patent: *Aug. 25, 2015

(54) LITHOGRAPHIC APPARATUS AND DEVICE MANUFACTURING METHOD

(75) Inventor: Theodorus Marinus Modderman, Nuenen (NL)

(73) Assignee: ASML NETHERLANDS B.V., Veldhoven (NL)

(*) Notice: Subject to any disclaimer, the term of this patent is extended or adjusted under 35 U.S.C. 154(b) by 743 days.

This patent is subject to a terminal disclaimer.

(21) Appl. No.: 13/188,096

(22) Filed: Jul. 21, 2011

(65) Prior Publication Data

US 2011/0279806 A1    Nov. 17, 2011

Related U.S. Application Data

(63) Continuation of application No. 12/327,414, filed on Dec. 3, 2008, now Pat. No. 8,233,137, which is a continuation of application No. 11/015,766, filed on Dec. 20, 2004, now Pat. No. 7,528,931.

(51) Int. Cl.
*G03B 27/52* (2006.01)
*G03B 27/42* (2006.01)
*G03B 27/58* (2006.01)
*G03F 7/20* (2006.01)

(52) U.S. Cl.
CPC .......... *G03F 7/70341* (2013.01); *G03F 7/7075* (2013.01)

(58) Field of Classification Search
CPC ..................... G03F 7/7025; G03F 7/70341
USPC .......................... 355/30, 53, 72–76
See application file for complete search history.

(56) References Cited

U.S. PATENT DOCUMENTS

| 3,573,975 A | 4/1971 | Dhaka et al. |
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,465,368 A | 8/1984 | Matsuura et al. |
| 4,480,910 A | 11/1984 | Takanashi et al. |
| 4,509,852 A | 4/1985 | Tabarelli et al. |
| 5,040,020 A | 8/1991 | Rauschenbach et al. |

(Continued)

FOREIGN PATENT DOCUMENTS

| DE | 206 607 | 2/1984 |
| DE | 221 563 | 4/1985 |

(Continued)

OTHER PUBLICATIONS

Japanese Office Action mailed Jun. 11, 2013 in corresponding Japanese Patent Application No. 2011-155420.

(Continued)

*Primary Examiner* — Hung Henry Nguyen
(74) *Attorney, Agent, or Firm* — Pillsbury Winthrop Shaw Pittman LLP (57) ABSTRACT

In a single or multiple stage lithography apparatus, a table provides a confining surface to a liquid supply system during, for example, substrate table exchange and/or substrate loading and unloading. In an embodiment, the table has a sensor to make a measurement of the projection beam during, for example, substrate table exchange and/or substrate loading and unloading.

15 Claims, 4 Drawing Sheets (56) References Cited

U.S. PATENT DOCUMENTS

| | | | |
|---|---|---|---|
| 5,121,256 A | 6/1992 | Corle et al. | |
| 5,610,683 A | 3/1997 | Takahashi | |
| 5,631,731 A | 5/1997 | Sogard | |
| 5,650,840 A | 7/1997 | Taniguchi et al. | |
| 5,825,043 A | 10/1998 | Suwa | |
| 5,900,354 A | 5/1999 | Batchelder | |
| 6,078,380 A | 6/2000 | Taniguchi et al. | |
| 6,191,429 B1 | 2/2001 | Suwa | |
| 6,236,634 B1 | 5/2001 | Lee et al. | |
| 6,455,862 B1 | 9/2002 | Van Der Veen et al. | |
| 6,496,257 B1* | 12/2002 | Taniguchi et al. | 356/239.2 |
| 6,600,547 B2 | 7/2003 | Watson et al. | |
| 6,603,130 B1 | 8/2003 | Bisschops et al. | |
| 6,646,729 B2 | 11/2003 | Van Der Laan et al. | |
| 7,009,683 B2 | 3/2006 | Sato | |
| 7,327,435 B2 | 2/2008 | Binnard | |
| 7,372,538 B2 | 5/2008 | Binnard | |
| 7,528,931 B2* | 5/2009 | Modderman | 355/53 |
| 8,233,137 B2* | 7/2012 | Modderman | 355/53 |
| 8,436,979 B2* | 5/2013 | Ebihara | 355/53 |
| 8,462,312 B2* | 6/2013 | Modderman | 355/30 |
| 2002/0020821 A1 | 2/2002 | Van Santen et al. | |
| 2002/0041377 A1 | 4/2002 | Hagiwara et al. | |
| 2002/0061469 A1 | 5/2002 | Tanaka | |
| 2002/0145717 A1 | 10/2002 | Baselmans et al. | |
| 2002/0163629 A1 | 11/2002 | Switkes et al. | |
| 2002/0167651 A1 | 11/2002 | Boonman et al. | |
| 2003/0047694 A1 | 3/2003 | Van Der Laan | |
| 2003/0123040 A1 | 7/2003 | Almogy | |
| 2004/0000627 A1 | 1/2004 | Schuster | |
| 2004/0075895 A1 | 4/2004 | Lin | |
| 2004/0114117 A1 | 6/2004 | Bleeker | |
| 2004/0114150 A1 | 6/2004 | Wegmann et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2004/0212791 A1 | 10/2004 | De Bokx et al. | |
| 2004/0227925 A1* | 11/2004 | Sato | 355/72 |
| 2004/0239954 A1 | 12/2004 | Bischoff | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0024609 A1 | 2/2005 | De Smit et al. | |
| 2005/0030497 A1 | 2/2005 | Nakamura | |
| 2005/0046813 A1 | 3/2005 | Streefkerk et al. | |
| 2005/0046934 A1 | 3/2005 | Ho et al. | |
| 2005/0052632 A1 | 3/2005 | Miyajima | |
| 2005/0094116 A1 | 5/2005 | Flagello et al. | |
| 2005/0094125 A1 | 5/2005 | Arai | |
| 2005/0122505 A1 | 6/2005 | Miyajima | |
| 2005/0132914 A1 | 6/2005 | Mulkens et al. | |
| 2005/0134817 A1 | 6/2005 | Nakamura | |
| 2005/0140948 A1 | 6/2005 | Tokita | |
| 2005/0146693 A1 | 7/2005 | Ohsaki | |
| 2005/0146694 A1 | 7/2005 | Tokita | |
| 2005/0151942 A1 | 7/2005 | Kawashima | |
| 2005/0200815 A1 | 9/2005 | Akamatsu | |
| 2005/0213065 A1 | 9/2005 | Kitaoka | |
| 2005/0213066 A1 | 9/2005 | Sumiyoshi | |
| 2005/0219489 A1 | 10/2005 | Nei et al. | |
| 2005/0233081 A1 | 10/2005 | Tokita | |
| 2006/0103826 A1 | 5/2006 | Kok et al. | |
| 2006/0103832 A1 | 5/2006 | Hazelton et al. | |
| 2007/0127006 A1 | 6/2007 | Shibazaki | |
| 2007/0247602 A1* | 10/2007 | Binnard | 355/30 |
| 2010/0182584 A1 | 7/2010 | Shibazaki | |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 403 714 | 3/2004 |
| FR | 2474708 | 7/1981 |
| JP | 58-202448 | 11/1983 |
| JP | 61-109053 | 5/1986 |
| JP | 62-065326 | 3/1987 |
| JP | 62-121417 | 6/1987 |
| JP | 63-157419 | 6/1988 |
| JP | 04-079212 | 3/1992 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-135400 | 5/1999 |
| JP | 11-162831 | 6/1999 |
| JP | 11-176727 | 7/1999 |
| JP | 11-283903 | 10/1999 |
| JP | 2000-058436 | 2/2000 |
| JP | 2000-091270 | 3/2000 |
| JP | 2000-164504 | 6/2000 |
| JP | 2001-091849 | 4/2001 |
| JP | 2011-332490 | 11/2001 |
| JP | 2004-343114 | 2/2004 |
| JP | 2004-259966 | 6/2004 |
| JP | 2004-193252 | 7/2004 |
| JP | 2004-247733 | 9/2004 |
| JP | 2004-289126 | 10/2004 |
| JP | 2004-289128 | 10/2004 |
| JP | 2005-019864 | 1/2005 |
| JP | 2006-074961 | 3/2006 |
| JP | 4671051 | 4/2011 |
| WO | 99/23692 | 5/1999 |
| WO | 99/49504 | 9/1999 |
| WO | WO 99/49504 | 9/1999 |
| WO | 2004/104654 | 2/2004 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 | 6/2004 |
| WO | WO 2004/055803 | 7/2004 |
| WO | WO 2004/057589 | 7/2004 |
| WO | WO 2004/057590 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | 2004/105107 | 12/2004 |
| WO | WO 2005/010611 | 2/2005 |
| WO | WO 2005/024517 | 3/2005 |
| WO | 2005/093792 | 10/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

(56) References Cited

OTHER PUBLICATIONS

B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "⅛ µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsyst.* 1(1):7-12 (2002).
Information Disclosure Statement as filed for U.S. Appl. No. 12/659,894, dated Mar. 24, 2010 (1 page).
Office Action in related Japanese application 2009-17645 dated Aug. 3, 2010.
Office Action in related Japanese application 2009-069826 dated Jan. 26, 2010.
U.S. Office Action mailed Nov. 30, 2012 in corresponding U.S. Appl. No. 13/189,212.
U.S. Office Action mailed Aug. 7, 2012 in corresponding U.S. Appl. No. 13/189,212.
Petition for Inter Parties Review, U.S. Pat. No. 7,528,931, *Nikon Corporation* (Petitioner) vs. *ASML Netherlands B.V.* (Patent Owner), p. i-47 (Oct. 1, 2014).
Patent Owner Mandatory Notices Information Under 37 C.F.R. §42.8, U.S. Pat. No. 7,528,931, *Nikon Corporation* (Petitioner) vs. *ASML Netherlands B.V.* (Patent Owner), p. 1-3 (Oct. 20, 2014).
Notice of Filing Date Accorded to Petition and Time for Filing Patent Owner Preliminary Response, U.S. Pat. No. 7,528,931, *Nikon Corporation* (Petitioner) vs. *ASML Netherlands B.V.* (Patent Owner), p. 1-3 (Nov. 3, 2014.
Declaration of Chris A. Mack and attachments, U.S. Pat. No. 7,528,931, *Nikon Corporation* (Petitioner) vs. *ASML Netherlands B.V.* (Patent Owner), 460 pages (Sep. 29, 2014).
U.S. Office Action dated Mar. 15, 2007 issued in U.S. Appl. No. 11/015,766.
Amendment dated Jun. 27, 2007 filed in U.S. Appl. No. 11/015,766.
U.S. Office Action dated Sep. 4, 2007 issued in U.S. Appl. No. 11/015,766.
Amendment dated Nov. 26, 2007 filed in U.S. Appl. No. 11/015,766.
U.S. Advisory Action dated Dec. 4, 2007 issued in U.S. Appl. No. 11/015,766.
U.S. Office Action dated Apr. 18, 2008 issued in U.S. Appl. No. 11/015,766.
Amendment dated Jul. 14, 2008 filed in U.S. Appl. No. 11/015,766.
Notice of Allowance dated Aug. 29, 2008 issued in U.S. Appl. No. 11/015,766.
Petition for Withdrawal from Issue—Issue Fee Paid dated Dec. 10, 2008 filed in U.S. Appl. No. 11/015,766.
Petition for Inter Parties Review, U.S. Pat. No. 8,233,137, *Nikon Corporation* (Petitioner) vs. *ASML Netherlands B.V.* (Patent Owner), p. i-59 (Oct. 1, 2014).
Patent Owner Mandatory Notices Information Under 37 C.F.R. §42.8, U.S. Pat. No. 8,233,137, *Nikon Corporation* (Petitioner) vs. *ASML Netherlands B.V.* (Patent Owner), p. 1-3 (Oct. 20, 2014).
Notice of Filing Date Accorded to Petition and Time for Filing Patent Owner Preliminary Response, U.S. Pat. No. 8,233,137, *Nikon Corporation* (Petitioner) vs. *ASML Netherlands B.V.* (Patent Owner), p. 1-3 (Nov. 3, 2014.
Declaration of Chris A. Mack and attachments, U.S. Pat. No. 8,233,137, *Nikon Corporation* (Petitioner) vs. *ASML Netherlands B.V.* (Patent Owner), 498 pages (Sep. 29, 2014).
Amendment and Terminal Disclaimer dated Jul. 5, 2011 filed in U.S. Appl. No. 12/327,414.
Provisional Application Cover Sheet and Disclosure of Invention dated Apr. 11, 2003 in U.S. Appl. No. 60/462,499.
Case IPR2015-00002, U.S. Pat. No. 7,528,931 B2, *Nikon Corporation v. ASML Netherlands B.V.*, "Judgment—Request for Adverse Judgment," United States Patent and Trademark Office, Before the Patent Trial and Appeal Board, pp. 1-3 (May 28, 2015).
Case IPR2015-00002, U.S. Pat. No. 7,528,931 B2, *Nikon Corporation v. ASML Netherlands B.V.*, "Patent Owner's Motion to Cancel All Claims in the Proceeding," United States Patent and Trademark Office, Before the Patent Trial and Appeal Board, 5 pages (May 26, 2015).
Case IPR2015-00003, U.S. Pat. No. 8,233,137 B2, *Nikon Corporation v. ASML Netherlands B.V.*, "Judgment—Request for Adverse Judgment," United States Patent and Trademark Office, Before the Patent Trial and Appeal Board, pp. 1-3 (May 28, 2015).
Case IPR2015-00003, U.S. Pat. No. 8,233,137 B2, *Nikon Corporation v. ASML Netherlands B.V.*, "Patent Owner's Motion to Cancel All Claims in the Proceeding," United States Patent and Trademark Office, Before the Patent Trial and Appeal Board, 8 pages (May 26, 2015).

\* cited by examiner

LITHOGRAPHIC APPARATUS AND DEVICE MANUFACTURING METHOD

This application is a continuation of U.S. patent application Ser. No. 12/327,414, filed on Dec. 3, 2008, which issued as U.S. Pat. No. 8,233,137 on Jul. 31, 2012, which is a continuation of U.S. patent application Ser. No. 11/015,766, filed on Dec. 20, 2004, now U.S. Pat. No. 7,528,931. The contents of each of the foregoing applications is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
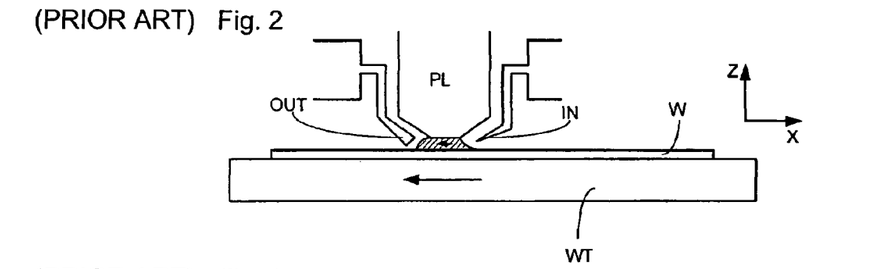
FIGS. 2 and 3 depict a liquid supply system for use in a lithographic projection apparatus.
Figure 3:
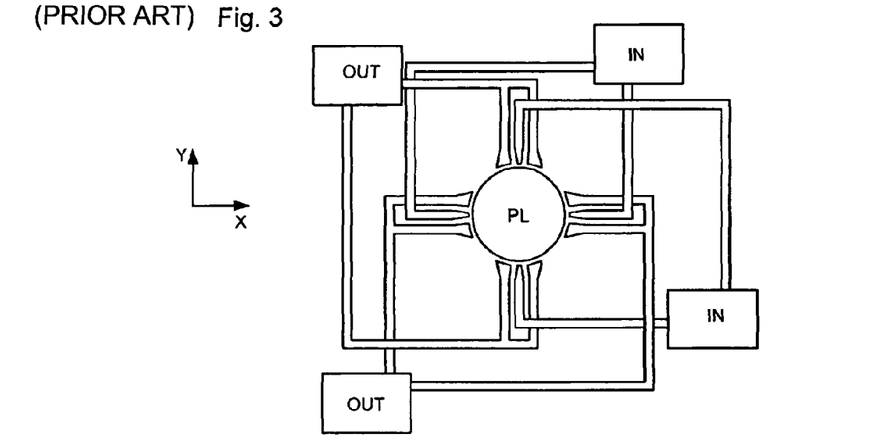

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

To maintain the performance of a lithographic apparatus, periodic measurements of the performance of the radiation source, illumination system and projection system may be taken so that corrective measures, such as recalibrations, can be taken if there is any degradation in the performance of any part of the apparatus. One or more sensors may be provided in the optical path of the apparatus to measure one or more parameters that may affect imaging but it is desired, and in some cases essential, to take measurements at substrate level and directly in the aerial image. Such measurements cannot be done concurrently with and at the same as production exposure so that periodic downtime is provided, reducing the throughput of the apparatus.

SUMMARY

Accordingly, it would be advantageous, for example, to provide a lithographic apparatus in which a measurement at substrate level may be performed without reduction in throughput.

According to an aspect of the invention, there is provided a positioning apparatus for use in a lithographic apparatus for projecting a patterned beam of radiation onto a substrate, the positioning apparatus comprising:

a first table connected to a first positioning system configured to displace the first table into and out of a path of the patterned beam of radiation, the first table being configured to hold a substrate; and a second table connected to a second positioning system configured to position the second table into the path of the patterned beam of radiation when the first table is displaced out of the path of the patterned beam of radiation, the second table not being configured to hold a substrate.

According to an aspect of the invention, there is provided a lithographic apparatus, comprising:

a substrate table configured to hold a substrate;

a projection system configured to project a patterned beam of radiation onto the substrate;

a first positioning system connected to the substrate table and configured to displace the substrate table into and out of a path of the patterned beam of radiation;

a sensor table not configured to hold a substrate and comprising a sensor configured to sense a property of the patterned beam of radiation; and a second positioning system configured to position the sensor table into the path of the patterned beam of radiation when the first table is displaced out of the path of the patterned beam of radiation.

According to another aspect of the invention, there is provided a device manufacturing method, comprising:

projecting a patterned beam of radiation onto a substrate held on a table;

displacing the table out of a path of the patterned beam of radiation; and moving a sensor into the path of the patterned beam of radiation and measuring a property of the beam, the moving of the sensor and the measuring of the property occurring at least partly concurrently with the displacing of the table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
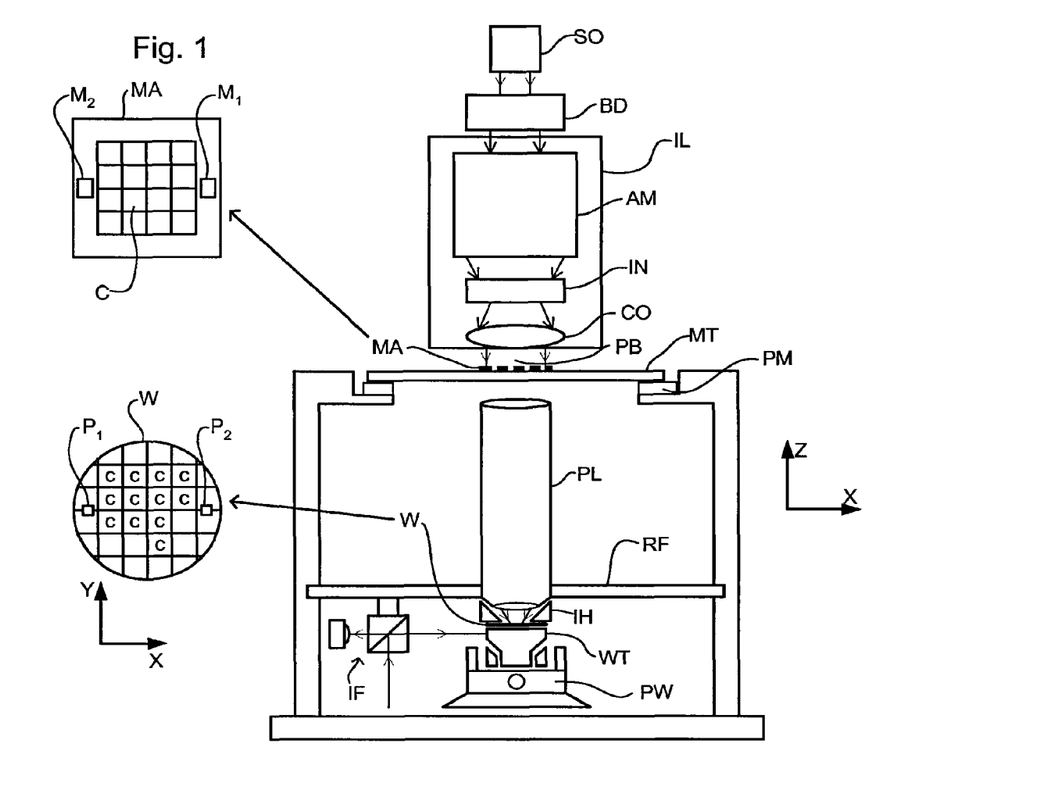
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof; for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
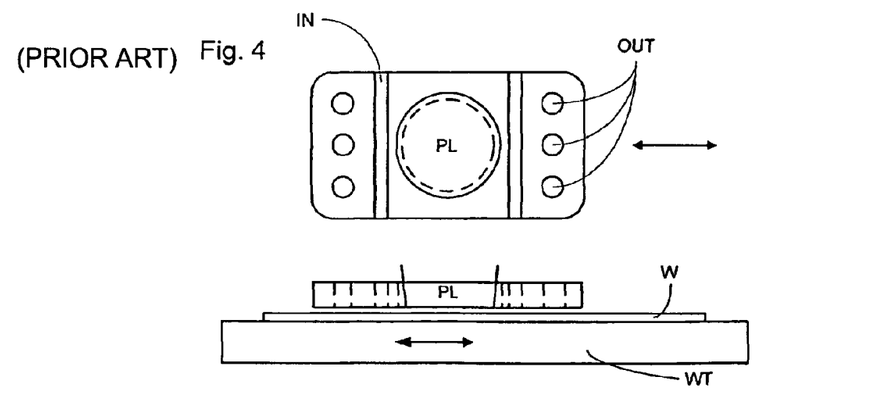
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. Ser. No. 10/705,783, hereby incorporated in its entirety by reference.

Figure 5:
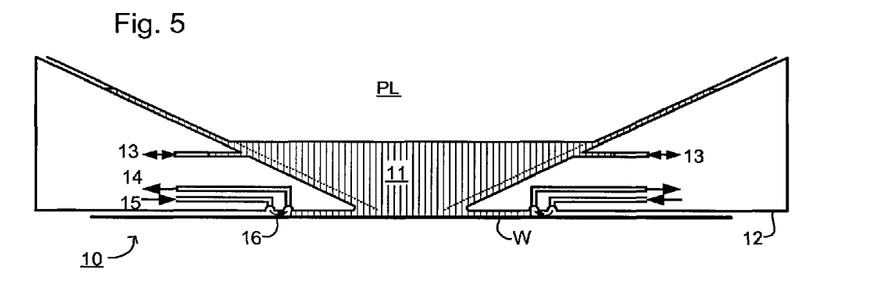
FIG. 5 depicts a liquid supply system for use in a lithographic apparatus according to an embodiment of the invention.

FIG. 5 shows a liquid supply system comprising a liquid confinement structure (sometimes referred to as an immersion hood or showerhead) according to an embodiment of the invention. In particular, FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

Figure 6:
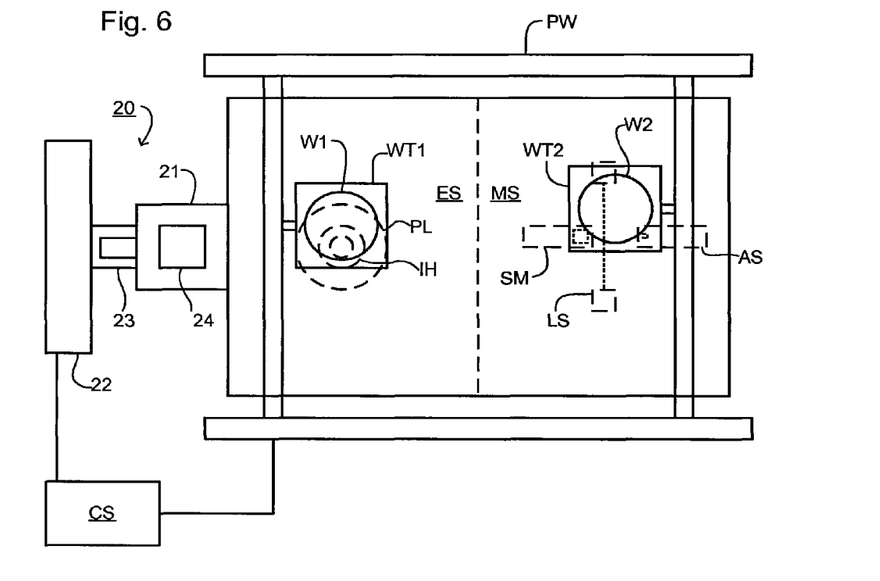
FIG. 6 depicts measurement and exposure stations of an embodiment of the invention.

FIG. 6 shows substrate stage arrangements according to an embodiment of the invention. The embodiment is a so-called dual stage apparatus in which at substrate level there are two stations: an exposure station ES and a measurement station MS. At the exposure station, substrates are exposed while at the measurement station various measurements are carried out, for example, to characterize a substrate prior to exposure or to verify that exposure has been carried out correctly. One or more sensors may be provided at the measurement station to perform the measurements and examples of the types of a sensor that may be provided at the measurement station include a level sensor LS to make a height map of a substrate prior to exposure, an alignment sensor AS to measure the position of one or more alignment markers on the substrate, and a scatterometer SM to examine the latent image of an exposed substrate. A load/unload robot (not shown) is also provided to load and unload substrates to a substrate table at the measurement station. In such a dual stage apparatus, while one substrate is being exposed, a previously exposed substrate can be measured and/or a next substrate to be exposed can be pre-measured. A dual stage apparatus therefore can have improved throughput as compared to a single stage apparatus in which both measurement and exposure steps are carried out at a single station.

Figure 7:
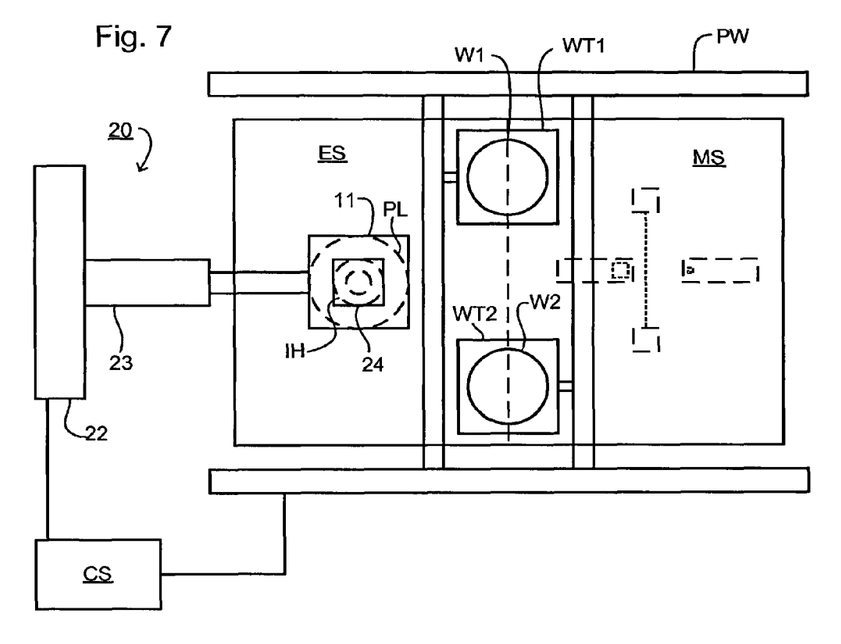
FIG. 7 is a view similar to FIG. 6 but showing the situation during table exchange.

Referring to FIG. 6, the apparatus has two substrate tables WT1, WT2 which are positioned by a positioning system PW comprising two H-drives, each to position a substrate table within one of the stations. As shown in FIG. 7, according to an embodiment, at the end of an exposure process, the two substrate tables WT1, WT2 are positioned at the boundary between the two stations and decoupled from the positioning system PW; each H-drive then pick-ups the substrate table released by the other H-drive. This procedure is sometimes referred to as a chuck swap or table exchange. Thus, the substrate W2 that has just been pre-measured at the measurement station can be exposed at the exposure station and the substrate W1 that has just been exposed can be measured and/or unloaded at the measurement station. An alternative arrangement has two measurement stations and two substrate tables but a single exposure station. Each substrate table is positioned by a drive system having a range including its own measurement station and the exposure station so that there is no exchange of tables between parts of the positioning system. However, there is still a period which may be referred to as table exchange during which one table is moving out of the exposure station and the other one is moving in.

In an immersion lithography apparatus with a localized liquid supply system, e.g. of the showerhead type, during the table exchange procedure the liquid supply system will be turned off or a closing surface provided to prevent immersion liquid from leaking into the remainder of the apparatus. In an embodiment, a closing plate may be provided in a recess on the substrate table from which it is picked up by a liquid confinement structure IH before the substrate table is moved out from under the projection system PL.

In an embodiment of the invention, a third table 21 is provided, with a positioning system 22, 23 that is capable of positioning the third table under the projection system PL and liquid confinement structure IH. The third table 21 and the positioning system 22, 23 may together form the third stage 20. The third table 21 may fulfill at least two functions. Firstly, it can provide a confining surface at the bottom of the liquid confinement structure IH when the substrate table WT1, WT2 is removed to prevent the immersion liquid leaking out into the remainder of the apparatus. Secondly, the third table 21 may comprise a sensor unit 24 comprising one or more sensors to make a measurement of the aerial image projected by the projection system PL. Types of sensor that can be included in the sensor unit include a transmission image sensor (TIS), an energy sensor, a polarization sensor and a shearing interferometer sensor (see, for example, U.S. patent application Ser. No. 10/988,845, filed Nov. 16, 2004, which document is hereby incorporated in its entirety by reference). In an embodiment, the sensor unit 24 may advantageously include a shearing interferometer sensor, which is used to characterize aberrations in the projection system PL, since the measurements taken by such a sensor take a comparatively long time and are important to imaging performance.

By providing the sensor unit to a third table 21, the sensor (s) can therefore be used to make a measurement at substrate level without reducing throughput by making use of the substrate table exchange interval. The reduction in downtime achievable may therefore be substantial. It should be noted that if the desired measurement(s) (e.g., measurements necessary for a calibration) takes longer than the time taken for substrate table exchange, the measurement(s) may be split into several parts and performed during several substrate table exchange periods, possibly with modifications to account for factors that may change over the period between measurements. Alternatively or in addition, the exchange period may be extended to accommodate the measurement(s) on one or more occasions causing some loss of throughput, but less than if the whole measurement were carried out during a substrate exposure downtime.

An advantage also accrues from providing a polarization sensor as part of the sensor unit on the third table as a polarization sensor can be quite bulky, involving several optical components, and therefore may be difficult to accommodate on one or both of the substrate tables WT1, WT2.

Depending, for example, on the type of sensor provided to the third table 21, the positioning system 22, 23 may comprise simply a long stroke drive module to position the third table 21 under the projection system PL, as shown in FIG. 7, in synchronism, for example, with the removal of the substrate table WT1, WT2. This may be carried out under control of a controller CS connected to the positioning system of the third table 21 and the positioning system of the substrate table WT1, WT2. Optionally, a short stroke drive module may be included if the sensor requires more accurate positioning and/or scanning to make the measurement. Where more than one sensor is provided, the sensors may be fitted into the area of the exposure field so as to operate simultaneously or if that is inconvenient, the positioning system may be arranged to position different sensors in the exposure field successively.

It should be noted that while the invention has been described in relation to a dual stage immersion type lithographic apparatus, it may also be used with non-immersion apparatus and with a single stage apparatus where the substrate table is moved out from under the projection system for substrate loading and unloading operations. The third table may also be provided with other devices, e.g. a cleaning device configured to cleaning a final element of the projection system, in addition to or instead of the sensor. The cleaning device may use gas, electric particles, a laser or other mechanisms for cleaning the projection system. A third table may also be used in an immersion lithography apparatus without a sensor or other device and rather simply to provide a confining surface for the liquid supply system during, for example, table exchange and/or substrate loading and unloading.

Further, a multiple (e.g., two) stage lithographic apparatus (with or without immersion capability) may comprise one exposure station and more than one measurement station. In this arrangement, for example, a measurement station may be provided on opposite sides of an exposure station, where the projection system is positioned, and then two substrate tables may be shuttled between the two measurement stations and the exposure station. As an example, a first substrate table may be shuttled between the exposure station and a first measurement station and the second substrate table may be shuttled between the exposure station and a second measurement station. In an implementation, the two substrate tables may be shuttled in tandem back and forth so that the first substrate table only moves between the exposure station and a first measurement station and the second substrate table moves only between the exposure station and a second measurement station.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

In an embodiment, there is provided a positioning apparatus for use in a lithographic apparatus for projecting a patterned beam of radiation onto a substrate, the positioning apparatus comprising: a first table connected to a first positioning system configured to displace the first table into and out of a path of the patterned beam of radiation, the first table being configured to hold a substrate; and a second table connected to a second positioning system configured to position the second table into the path of the patterned beam of radiation when the first table is displaced out of the path of the patterned beam of radiation, the second table not being configured to hold a substrate.

In an embodiment, the second table comprises a sensor table comprising a sensor configured to sense a property of the patterned beam of radiation. In an embodiment, the sensor is selected from the group comprising: an energy sensor, a transmission image sensor, a polarization sensor, and a shearing interferometer sensor. In an embodiment, the apparatus further comprises a liquid supply system configured to supply a liquid to a space between a projection system and the substrate, and wherein the second table provides a surface to at least partly bound the space when the first table is displaced out of the path of the patterned beam of radiation. In an embodiment, the apparatus further comprises a controller connected to the first and second positioning systems and configured to control the respective positioning systems to position the second table into the path of the patterned beam of radiation in synchronism with displacement of the first table out of the path of the patterned beam of radiation. In an embodiment, the second positioning system comprises a long stroke module and a short stroke module, the short stroke module having a smaller range of movement but a higher precision than the long stroke module. In an embodiment, the apparatus further comprises: a third table configured to hold a substrate; an exposure station at which a substrate carried by either one of the first and third tables can be exposed; and a measurement station at which a substrate carried by either one of the first and third tables can be measured, wherein the first positioning system is configured to exchange the first and third tables between the measurement station and the exposure station. In an embodiment, the apparatus further comprises: a third table configured to hold a substrate; an exposure station at which a substrate carried by either one of the first and third tables can be exposed; and first and second measurement stations at which a substrate carried by either one of the first and third tables can be measured, wherein the first positioning system is configured to exchange the first and third tables between the exposure station and the respective one of the measurement stations. In an embodiment, the second table has mounted thereon a cleaning device configured to clean a projection system of the lithographic apparatus.

In an embodiment, there is provided a lithographic apparatus, comprising: a substrate table configured to hold a substrate; a projection system configured to project a patterned beam of radiation onto the substrate; a first positioning system connected to the substrate table and configured to displace the substrate table into and out of a path of the patterned beam of radiation; a sensor table not configured to hold a substrate and comprising a sensor configured to sense a property of the patterned beam of radiation; and a second positioning system configured to position the sensor table into the path of the patterned beam of radiation when the first table is displaced out of the path of the patterned beam of radiation.

In an embodiment, the apparatus further comprises a liquid supply system configured to supply a liquid to a space between a projection system and the substrate, and wherein the sensor table provides a surface to at least partly bound the space when the substrate table is displaced out of the path of the patterned beam of radiation. In an embodiment, the apparatus further comprises a controller connected to the first and second positioning systems and configured to control the respective positioning systems to position the sensor table into the path of the patterned beam of radiation in synchronism with displacement of the substrate table out of the path of the patterned beam of radiation. In an embodiment, the sensor is selected from the group comprising: an energy sensor, a transmission image sensor, a polarization sensor, and a shearing interferometer sensor. In an embodiment, the apparatus further comprises: a further substrate table configured to hold a substrate; an exposure station at which a substrate carried by either one of the substrate table and the further substrate table can be exposed; and a measurement station at which a substrate carried by either one of the substrate table and the further substrate table can be measured, wherein the first positioning system is configured to exchange the substrate table and the further substrate table between the measurement station and the exposure station.

In an embodiment, there is provided a device manufacturing method, comprising: projecting a patterned beam of radiation onto a substrate held on a table; displacing the table out of a path of the patterned beam of radiation; and moving a sensor into the path of the patterned beam of radiation and measuring a property of the beam, the moving of the sensor and the measuring of the property occurring at least partly concurrently with the displacing of the table.

In an embodiment, the sensor is selected from the group comprising: an energy sensor, a transmission image sensor, a polarization sensor, and a shearing interferometer sensor. In an embodiment, the method further comprises supplying a liquid to a space between a projection system of a lithographic apparatus and the substrate, and at least partly bounding the space with the sensor or a table holding the sensor when the table is displaced out of the path of the patterned beam of radiation. In an embodiment, the method further comprises cleaning a projection system of a lithographic apparatus used to project the patterned beam of radiation. In an embodiment, the projecting the patterned beam of radiation occurs at an exposure station and the displacing the table comprises displacing the table from the exposure station to a measurement station. In an embodiment, the method further comprises measuring a property of the substrate at the measurement station. In an embodiment, the method further comprises displacing an additional table holding a substrate from the measurement station to the exposure station. In an embodiment, the method further comprises displacing an additional table holding a substrate from another measurement station to the exposure station.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a projection system configured to project a beam of radiation onto a substrate;
   a first table configured to support a substrate;
   a second table, not being configured to support a substrate, comprising a sensor unit configured to sense a property of a beam of radiation from the projection system;
   a liquid supply system configured to supply a liquid to a space between the projection system and the substrate;
   a sensor system configured to measure a height of the substrate on the first table and/or measure the position of an alignment marker of the substrate on the first table, the sensor system located at a first side of a path traversed by the beam of radiation; and
   a controller configured to control positioning of the second table from in the path to a position out of the path at a second side opposite the first side in synchronism with displacement of the first table into the path.

2. The apparatus of claim 1, wherein the sensor system comprises a level sensor configured to measure the height of the substrate.

3. The apparatus of claim 1, wherein the sensor system comprises an alignment sensor configured to measure the position of an alignment marker of the substrate.

4. The apparatus of claim 1, wherein the second table provides a surface to at least partly bound the space to contain the liquid in the space when the first table is displaced into the path.

5. The apparatus of claim 1, wherein the liquid supply system comprises a liquid confinement structure spaced apart from the first and second tables, the liquid confinement structure having a generally horizontal confinement surface surrounding the path to confine the liquid in the space so that a reservoir of the liquid is formed within the liquid confinement structure, the confinement surface having an open aperture to allow liquid to flow therethrough, the open aperture located between the bottom surface and the facing surface, and the confinement surface having an outlet configured to remove liquid from the space.

6. The apparatus of claim 5, further comprising an opening configured to supply the liquid to the space, the opening located between the bottom surface and the facing surface.

7. The apparatus of claim 5, wherein the liquid confinement structure is movable in a vertical direction.

8. The apparatus of claim 1, wherein the second side does not have a level sensor configured to measure the height of the substrate or an alignment sensor configured to measure the position of an alignment marker of the substrate.

9. A lithographic apparatus comprising:
   a projection system configured to project a beam of radiation onto a surface of a substrate, the projection system having a final optical element with a bottom surface;
   a first table configured to support a substrate;
   a second table, not being configured to support a substrate, comprising a sensor unit configured to sense a property of a beam of radiation from the projection system, the second table configured to move under the bottom surface when the first table is moved out from a position underneath the bottom surface, the first and second tables being independently movable from each other; and
   a liquid supply system configured to supply a liquid to a space between the projection system and the surface of the substrate, the liquid supply system comprising a liquid confinement structure having a confinement surface that faces toward the surface of the substrate and that is configured to contact and surround a reservoir of liquid in the space to confine liquid in the reservoir, the confinement surface comprising an outlet configured to remove liquid, the outlet extending around the reservoir, and wherein a footprint defined by the outer periphery of the confinement surface is encompassed by a footprint defined by the outer periphery of a bottom part, above the liquid confinement structure, of the projection system.

10. The apparatus of claim 9, wherein the confinement surface has an open aperture to allow liquid to flow therethrough, the open aperture located underneath the bottom surface and having a width smaller than a width of the bottom surface.

11. The apparatus of claim 10, further comprising an opening configured to supply the liquid to the space, the opening located between the bottom surface and the facing surface.

12. The apparatus of claim 9, wherein the second table is configured to provide a confining surface at a bottom of the liquid confinement structure when the first table is removed from under the projection system so as to prevent the liquid from leaking out into the remainder of the lithographic apparatus.

13. The apparatus of claim 12, further comprising a controller configured to control positioning of the second table into a position underneath the bottom surface in synchronism with displacement of the first table away from underneath the bottom surface.

14. The apparatus of claim 9, further comprising a cleaning device configured to clean an element of the lithographic apparatus, the element arranged to contact the liquid.

15. The apparatus of claim 14, wherein the cleaning device is configured to clean using at least one selected from the following: gas, electric particles, and/or a beam of radiation.

* * * * *